US009859914B1

United States Patent
Weng et al.

(10) Patent No.: US 9,859,914 B1
(45) Date of Patent: Jan. 2, 2018

(54) DELTA-SIGMA MODULATOR WITH DELTA-SIGMA TRUNCATOR AND ASSOCIATED METHOD FOR REDUCING LEAKAGE ERRORS OF DELTA-SIGMA MODULATOR

(71) Applicant: MEDIATEK INC., Hsin-Chu (TW)

(72) Inventors: Chan-Hsiang Weng, Kaohsiung (TW); Tien-Yu Lo, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/647,253

(22) Filed: Jul. 11, 2017

Related U.S. Application Data

(60) Provisional application No. 62/371,226, filed on Aug. 5, 2016.

(51) Int. Cl.
*H03M 3/00* (2006.01)
*H03M 1/12* (2006.01)
*H03M 1/00* (2006.01)

(52) U.S. Cl.
CPC ......... *H03M 3/426* (2013.01); *H03M 3/436* (2013.01); *H03M 1/00* (2013.01); *H03M 1/12* (2013.01); *H03M 3/30* (2013.01)

(58) Field of Classification Search
CPC ............. H03M 1/00; H03M 1/12; H03M 3/30
USPC ................................. 341/143, 120, 155, 156
See application file for complete search history.

(56) References Cited

U.S. PATENT DOCUMENTS 9,634,687 B2 * 4/2017 Huang ................. H03M 3/422

OTHER PUBLICATIONS

Maghari, "Sturdy MASH delta-sigma modulator", Electronics Letters Oct. 26, 2006 vol. 42 No. 22, Oct. 2006.
Lee, "A 66dB SNDR 15MHz BW SAR Assisted delta-sigma ADC in 22nm Tri-gate CMOS", 2013 Symposium on VLSI Circuits Digest of Technical Papers, 2013.
Yu, "A Low-Power Multi-Bit Sigma-Delta Modulator in 90-nm Digital CMOS Without DEM", IEEE Journal of Solid-State Circuits, vol. 40, No. 12, Dec. 2005, Dec. 2005.
Westerveld, "A 115dB-DR Audio DAC with −61dBFS Out-of-Band Noise", 2015 IEEE International Solid-State Circuits Conference, 2015.

* cited by examiner

*Primary Examiner* — Joseph Lauture
(74) *Attorney, Agent, or Firm* — Winston Hsu

(57) ABSTRACT

A delta-sigma modulator includes a receiving circuit, a loop filter module, a quantizer, a delta-sigma truncator, a digital filter module, and an output circuit. The receiving circuit is arranged for receiving a feedback signal and an input signal to generate a summation signal. The loop filter module is arranged for filtering the summation signal to generate a filtered summation signal. The quantizer is arranged for generating a first digital signal according to the filtered summation signal. The delta-sigma truncator is arranged for truncating the first digital signal to generate a second digital signal. The digital filter module is arranged for filtering the first digital signal and the second digital signal to generate a filtered first digital signal and a filtered second digital signal, respectively. The output circuit is arranged for generating an output signal according to the filtered first digital signal and the filtered second digital signal.

15 Claims, 5 Drawing Sheets

DELTA-SIGMA MODULATOR WITH DELTA-SIGMA TRUNCATOR AND ASSOCIATED METHOD FOR REDUCING LEAKAGE ERRORS OF DELTA-SIGMA MODULATOR

CROSS REFERENCE TO RELATED APPLICATIONS

This application claims the priority of U.S. Provisional Application No. 62/371,226, filed on Aug. 5, 2016, which is included herein by reference in its entirety.

BACKGROUND

In a conventional delta-sigma modulator with a multi-bit quantizer, a multi-level digital-to-analog converter (DAC) is required to feedback an output signal of the delta-sigma modulator and to work with a loop filter and a quantizer to implement a close-loop system for noise-shaping function. However, a mismatch between the DAC cells contributes mismatch errors to worsen a signal-to-noise plus distortion ratio (SNDR) and Spurious free dynamic range (SFDR). A dynamic element matching (DEM) function is a well-known strategy to address the mismatch issue of the multi-level DAC, but the hardware complexity grows exponentially as a bit number of the DAC increases.

SUMMARY

It is therefore an objective of the present invention to provide a delta-sigma modulator (delta-sigma ADC) with a delta-sigma truncator, which can lower the feedback digital output signal of the DAC while keeping a high bit number of the quantizer, to solve the above-mentioned problem. In addition, to improve a truncation error induced by the delta-sigma truncator, a digital filter module is applied to suppress the truncation error.

According to one embodiment of the present invention, a delta-sigma modulator comprises a receiving circuit, a loop filter module, a quantizer, a delta-sigma truncator, a digital filter module, an output circuit and a DAC. The receiving circuit is arranged for receiving a feedback signal and an input signal to generate a summation signal. The loop filter module is coupled to the receiving circuit, and is arranged for filtering the summation signal to generate a filtered summation signal. The quantizer is coupled to the loop filter module, and is arranged for generating a first digital signal according to the filtered summation signal. The delta-sigma truncator is coupled to the quantizer, and is arranged for truncating the first digital signal to generate a second digital signal, wherein a bit number of the second digital signal is less than a bit number of the first digital signal. The digital filter module is coupled to the quantizer and the delta-sigma truncator, and is arranged for filtering the first digital signal and the second digital signal to generate a filtered first digital signal and a filtered second digital signal, respectively. The output circuit is arranged for generating an output signal according to the filtered first digital signal and the filtered second digital signal. The DAC is coupled to the delta-sigma truncator and the receiving circuit, and is arranged for generating the feedback signal to the receiving circuit according to the second digital signal.

According to another embodiment of the present invention, a method for reducing leakage errors of an analog-to-digital converter comprises: receiving a feedback signal and an input signal to generate a summation signal; filtering the summation signal to generate a filtered summation signal; quantizing the filtered summation signal to generate a first digital signal; using a delta-sigma truncator to truncate the first digital signal to generate a second digital signal, wherein a bit number of the second digital signal is less than a bit number of the first digital signal; filtering the first digital signal and the second digital signal to generate a filtered first digital signal and a filtered second digital signal, respectively; and generating an output signal according to the filtered first digital signal and the filtered second digital signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
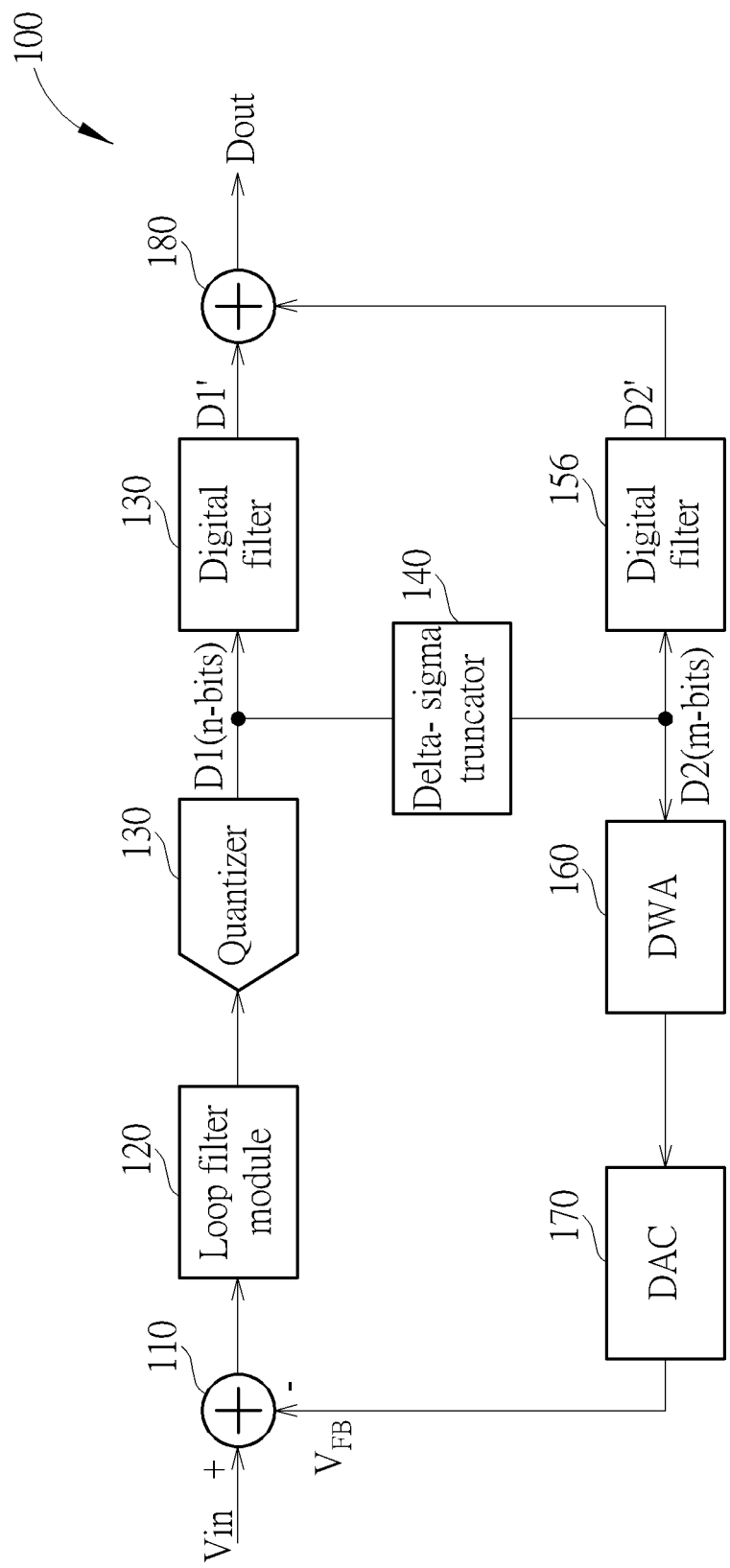
FIG. 1 is a diagram illustrating a delta-sigma modulator according to one embodiment of the present invention.

Please refer to FIG. 1, which is a diagram illustrating a delta-sigma modulator 100 according to one embodiment of the present invention. As shown in FIG. 1, the delta-sigma modulator 100 comprises a receiving circuit 110, a loop filter module 120, a quantizer 130, a delta-sigma truncator 140, a digital filter module comprising at least two digital filters 152 and 156, a data weighted averaging (DWA) circuit 160 and a DAC 170. In the operations of the delta-sigma modulator 100, the receiving circuit 110 receives an input signal Vin and a feedback signal $V_{FB}$, and calculates a difference by subtracting the feedback signal $V_{FB}$ by the input signal Vin to generate a summation signal. The loop filter module 120 is arranged to filter the summation signal to generate a filtered summation signal. The quantizer 130 is arranged to generate an n-bit first digital signal D1 according to the filtered summation signal. The delta-sigma truncator 140 truncates the n-bit first digital signal D1 with noise shaping to generate a m-bit second digital signal D2, where "m" is less than "n" (for example, the first digital signal D1 may be 9 bits, the second digital signal D2 may be four most significant bits (MSBs) of the first digital signal D1). The digital filter 152 filters the first digital signal D1 to generate a filtered first digital signal D1', and the digital filter 156 filters the second digital signal D2 to generate a filtered second digital signal D2'. The output circuit 180 combines the filtered first digital signal D1' and the filtered second digital signal D2' to generate an output signal Dout. In addition, the m-bit second digital signal D2 is processed by the DWA circuit 160 and the DAC 170 to generate the feedback signal $V_{FB}$ to the receiving circuit 110.

In addition, a DEM circuit and/or a phase adjustment circuit may be positioned in the feedback path of the delta-sigma modulator 100.

Because the delta-sigma truncator 140 truncates the n-bit first digital signal D1 with noise shaping to generate the m-bit second digital signal D2, the DWA circuit 160 and the DAC 170 only needs to process the digital signals with less bits, so the hardware complexity of the DWA circuit 160 and the DAC 170 can be simplified to save the design and manufacturing cost.

Besides the quantization error from the quantizer 130, the truncation operation may induce a truncation error that can be regarded as the quantization error, and the delta-sigma truncator 140 can shape the truncation error to a high-frequency band. However, when the truncation error is large (e.g. n−m>3) and a low oversampling ratio (low-OSR) is applied, the shaping ability is usually not good enough to suppress the truncation error to achieve the target SDNR. In detail, when the delta-sigma truncator 140 is a first-order delta-sigma truncator, the truncation error dominates the performance of the delta-sigma modulator 100, and as the order of the delta-sigma truncator 140 increases, a noise floor of the delta-sigma modulator 100 is suppressed. With the third-order delta-sigma truncator 140, a low-frequency noise floor of the delta-sigma modulator 100 with a 4-bit DAC 170 is close to a counterpart of a delta-sigma modulator with a 9-bit DAC. However, in the low-OSR application, the elevated high-frequency noise floor still dominates a signal-to-quantization-noise ratio (SQNR), that is the high-order delta-sigma truncator only works well in the high-OSR applications. Therefore, in the embodiment shown in FIG. 1, the delta-sigma truncator 140 sweeps the truncation error to the high-frequency band, and the digital filters 152 and 156 are used to cancel the truncation error in an open-loop manner to enhance SQNR.

Ideally, the transfer function of the digital filters 152 and 156 should match the transfer function of the loop filter module 120. Because of the semiconductor process issue, however, there is an existing mismatch between the digital filters 152 and 156 and the loop filter module 120. The existing mismatch between the digital filters 152 and 156 and the loop filter module 120 may induce a leakage error that elevates the noise floor of an output spectrum of the delta-sigma modulator 100. In the embodiment shown in FIG. 1, because of the operations of the delta-sigma truncator 140, the matching requirement of the digital filters 152 and 156 and the loop filter module 120 is relaxed.

In light of above, the digital filters 152 and 156 can suppress the truncation error produced by the delta-sigma truncator 140 to enhance the SQNR, and the delta-sigma truncator 140 can relax the matching requirement of the digital filters 152 and 156 and the loop filter module 120. Therefore, by using the delta-sigma truncator 140 and the digital filters 152 and 156 together in the delta-sigma modulator 100, the hardware complexity can be reduced while keeping the performance of the delta-sigma modulator 100.

Figure 2:
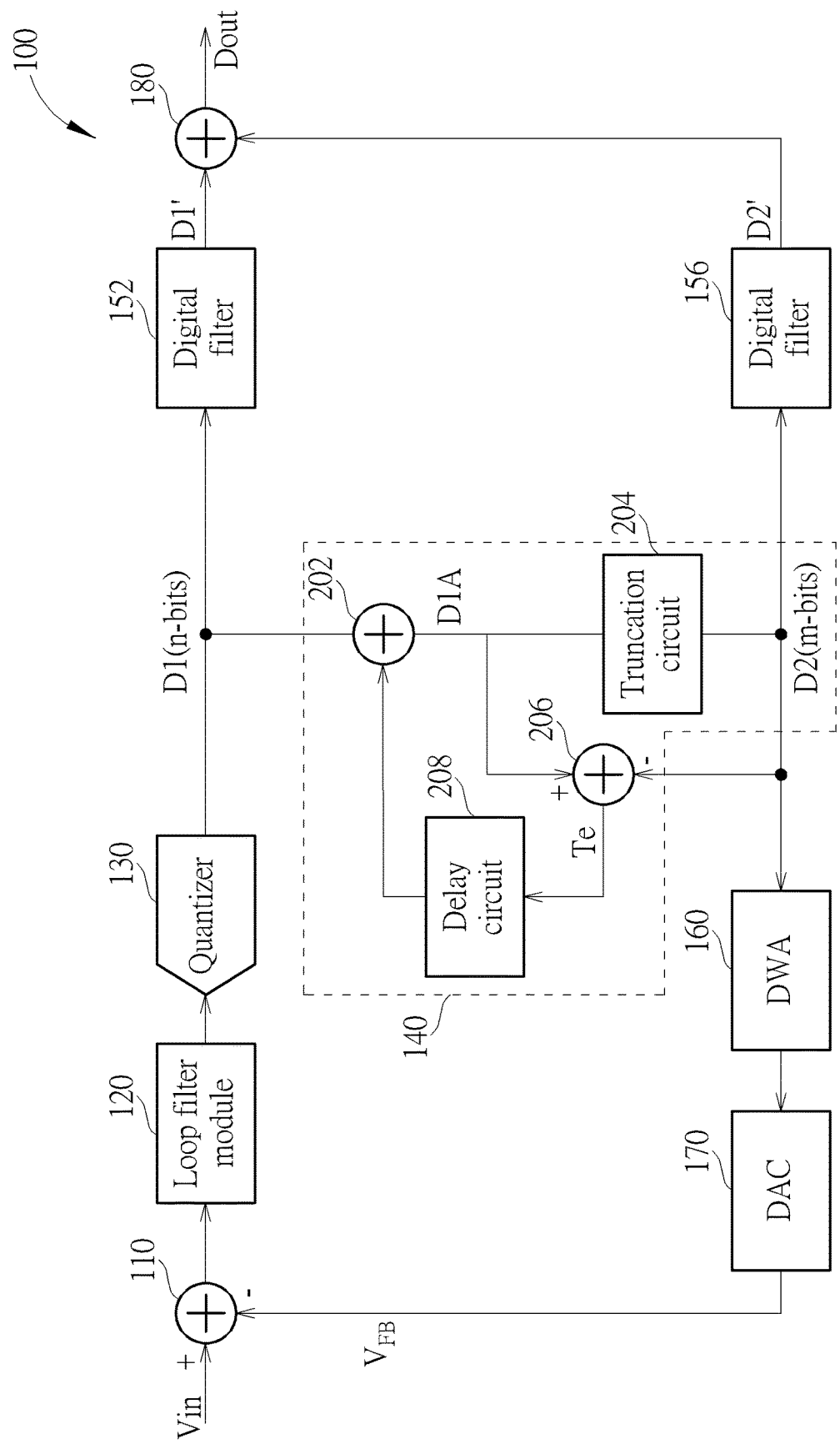
FIG. 2 is a diagram illustrating the delta-sigma truncator, the digital filter module and the output circuit according to one embodiment of the present invention.

Please refer to FIG. 2, which is a diagram illustrating the delta-sigma truncator 140, the digital filter module and the output circuit 180 according to one embodiment of the present invention. As shown in FIG. 2, the delta-sigma truncator 140 comprises a combiner 202, a truncation circuit 204, a truncation error generator 206 and a delay circuit 208. In the operations of the embodiment shown in FIG. 2, the combiner 202 combines the first digital signal D1 and a digital feedback signal from the delay circuit 208 to generate an adjusted first digital signal D1A. The truncation circuit 204 truncates the n-bit adjusted first digital signal D1A to generate the m-bit second digital signal D2. The truncation error generator 206 is implemented by a subtractor, and the truncation error generator 206 generates a truncation error signal Te according to a difference between the adjusted first digital signal D1A and the second digital signal D2. Then, the delay circuit 208 delays the truncation error signal Te to generate the digital feedback signal to the combiner 202. In addition, the output circuit 180 combines the filtered first digital signal D1' and the filtered second digital signal D2' to generate the output signal Dout.

In the embodiment shown in FIG. 2, the order of the delta-sigma truncator 140 can be determined according to the setting of the delay circuit 208. In detail, the delta-sigma truncator 140 is a first-order delta-sigma truncator when the delay circuit 208 has a transfer function "$z^{-1}$" in a z-domain, the delta-sigma truncator 140 is a second-order delta-sigma truncator when the delay circuit 208 has a transfer function "$a*z^{-1}-b*z^{-2}$" in the z-domain. In addition, by properly setting the parameters "a" and "b" in the transfer function "$a*z^{-1}-b*z^{-2}$", the delta-sigma truncator 140 can further have a notch response in the frequency domain to improve the SDNR.

Figure 3:
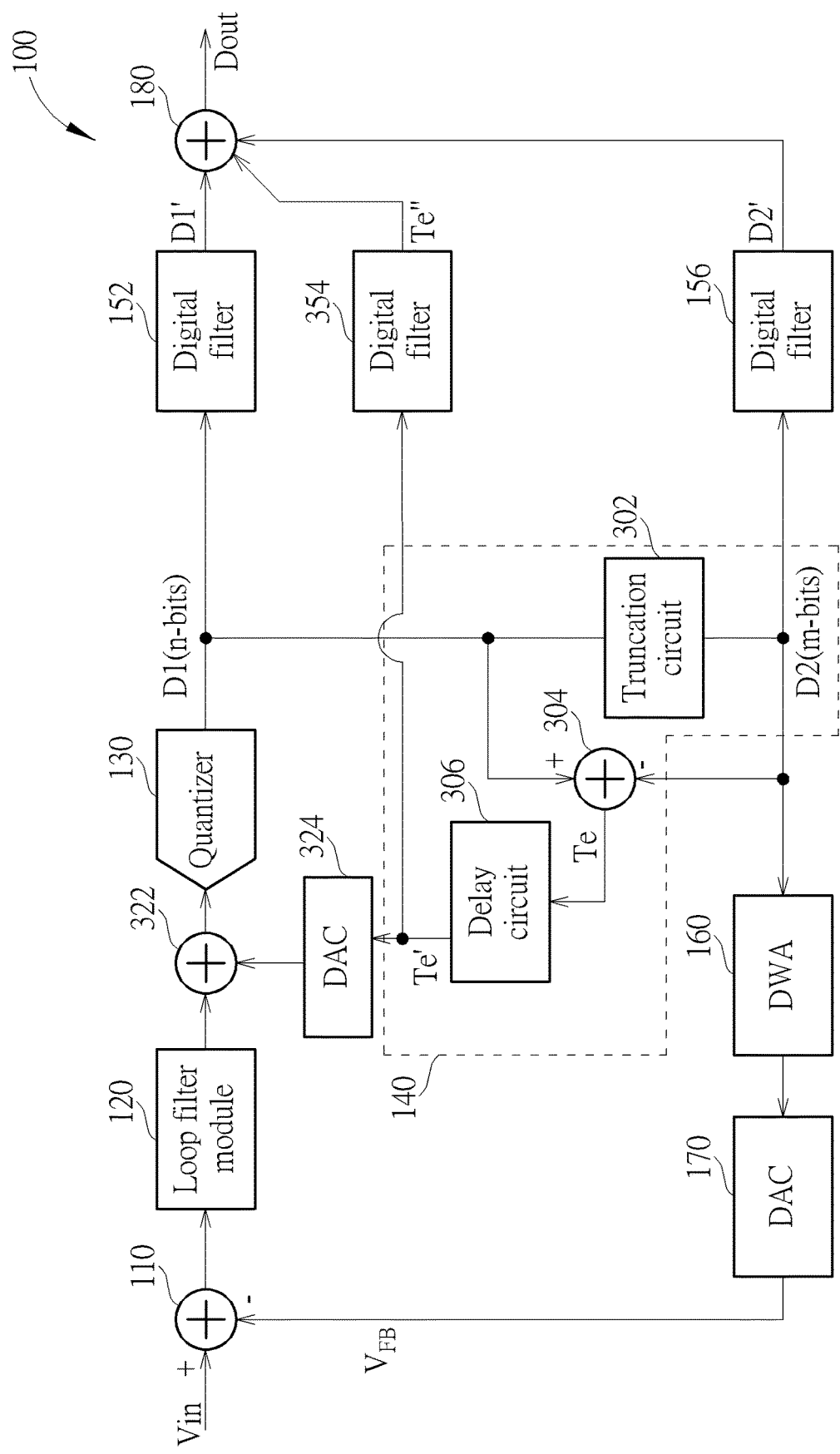
FIG. 3 is a diagram illustrating the delta-sigma truncator, the digital filter module, the output circuit and some modifications of the delta-sigma modulator according to another embodiment of the present invention.

Please refer to FIG. 3, which is a diagram illustrating the delta-sigma truncator 140, the digital filter module and some modifications of the delta-sigma modulator 100 according to another embodiment of the present invention. As shown in FIG. 3, the delta-sigma truncator 140 comprises a truncation circuit 302, a truncation error generator 304 and a delay circuit 304; the delta-sigma modulator 100 further comprises a combiner 322 and a DAC 324; and the digital filter module further comprises a digital filter 354. In the operations of the embodiment shown in FIG. 3, the truncation circuit 302 truncates the n-bit first digital signal D1 to generate the m-bit second digital signal D2. The truncation error generator 304 is implemented by a subtractor, and the truncation error generator 304 generates a truncation error signal Te according to a difference between the first digital signal D1 and the second digital signal D2. Then, the delay circuit 306 delays the truncation error signal Te to generate a delayed truncation error signal Te'. The DAC 324 performs a digital-to-analog converting operation upon the delayed truncation error signal Te' to generate an analog truncation error signal to the combiner 322, and the combiner 322 combines the filtered summation signal generated by the loop filter module 120 and the analog truncation error signal to adjust the filtered summation signal, and the quantizer 130 generates the first digital signal D1 according to the adjusted filtered summation signal. In addition, the digital filter 354 filters the delayed truncation error signal Te' to generate a filtered delayed truncation error signal Te'', and the output circuit 180 combines the filtered first digital signal D1', the filtered second digital signal D2' and the filtered delayed truncation error signal Te'' to generate the output signal Dout.

In one embodiment, the digital filters 352 and 354 have the same transfer function.

In the embodiment shown in FIG. 3, the order of the delta-sigma truncator 140 can be determined according to the setting of the delay circuit 306. In detail, the delta-sigma truncator 140 is a first-order delta-sigma truncator when the delay circuit 306 has a transfer function "$z^{-1}$" in a z-domain, the delta-sigma truncator 140 is a second-order delta-sigma truncator when the delay circuit 306 has a transfer function "$a*z^{-1}-b*z^{-2}$" in the z-domain. In addition, by properly setting the parameters "a" and "b" in the transfer function "$a*z^{-1}-b*z^{-2}$", the delta-sigma truncator 140 can further have a notch response in the frequency domain to improve the SDNR.

Figure 4:
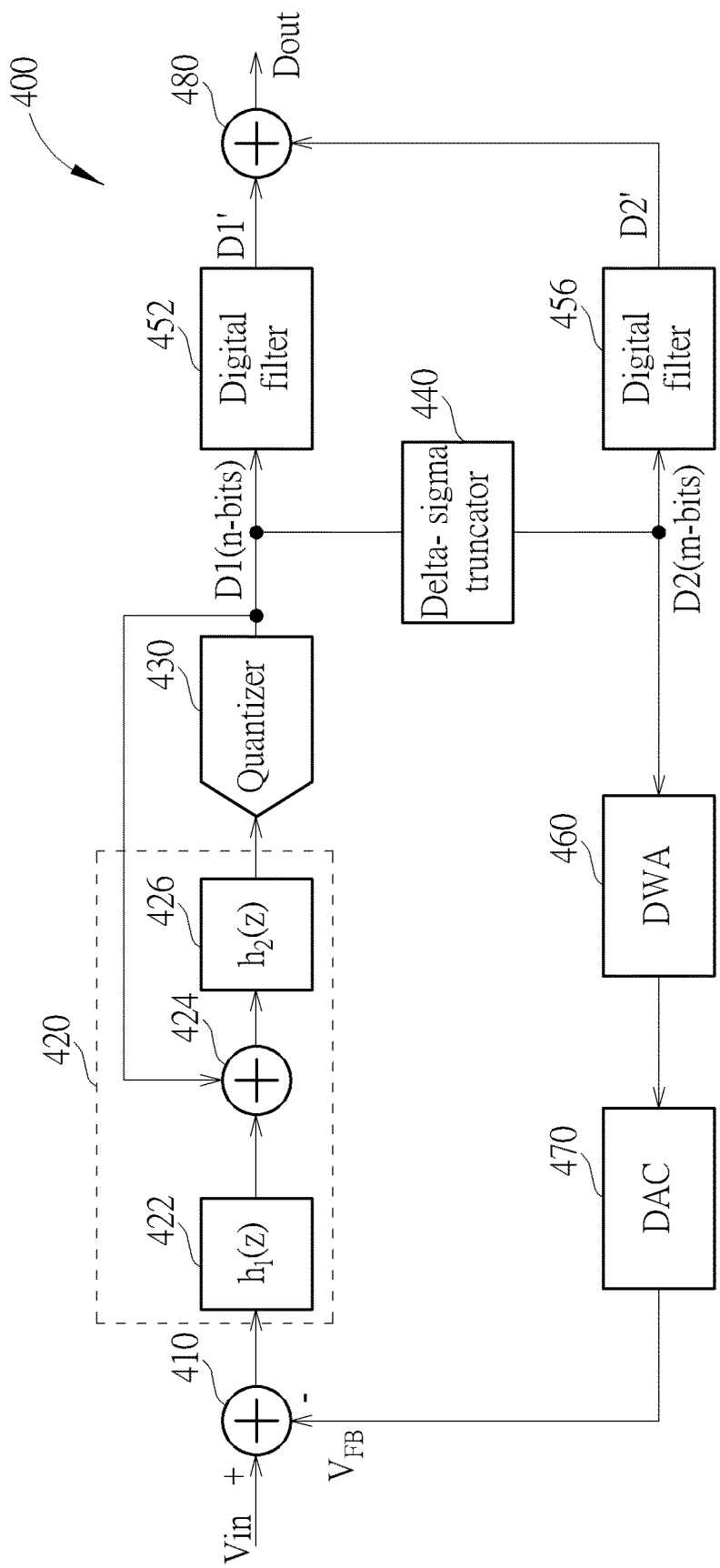
FIG. 4 is a diagram illustrating a delta-sigma modulator according to another embodiment of the present invention.

Please refer to FIG. 4, which is a diagram illustrating a delta-sigma modulator 400 according to another embodiment of the present invention. As shown in FIG. 4, the delta-sigma modulator 400 comprises a receiving circuit 410, a loop filter module 420, a quantizer 430, a delta-sigma truncator 440, a digital filter module comprising at least two digital filters 452 and 456, a DWA circuit 460 and a DAC 470. In the operations of the delta-sigma modulator 400, the receiving circuit 410 receives an input signal Vin and a feedback signal $V_{FB}$, and calculates a difference by subtracting the feedback signal $V_{FB}$ by the input signal Vin to generate a summation signal. The loop filter module 420 is arranged to filter the summation signal to generate a filtered summation signal. The quantizer 430 is arranged to generate an n-bit first digital signal D1 according to the filtered summation signal. The delta-sigma truncator 440 truncates the n-bit first digital signal D1 with noise shaping to generate a m-bit second digital signal D2, where "m" is less than "n". The digital filter 452 filters the first digital signal D1 to generate a filtered first digital signal D1', and the digital filter 456 filters the second digital signal D2 to generate a filtered second digital signal D2'. The output circuit 480 combines the filtered first digital signal D1' and the filtered second digital signal D2' to generate an output signal Dout. In addition, the m-bit second digital signal D2 is processed by the DWA circuit 460 and the DAC 470 to generate the feedback signal $V_{FB}$ to the receiving circuit 410.

In the embodiment shown in FIG. 4, the loop filter module 420 comprises a filter 422 having a transfer function h1(z), a combiner 424, and a filter 426 having a transfer function h2(z). The filter 422 is arranged to filter the summation signal generated by the receiving circuit 410. The combiner 424 combines an output of the filter 422 and a feedback adjusting signal, wherein the feedback adjusting signal is generated according to the first digital signal D1 generated by the quantizer (e.g. the DAC operation is performed on the first digital signal D1 to generate the feedback adjusting signal). The filter 426 is arranged to filter an output of the combiner 424 to generate the filtered summation signal to the quantizer.

In this embodiment, the transfer function of the digital filter 452 may be (h2(z)+1)/(1+h2(z)+h1(z)*h2(z)), and the transfer function of the digital filter 456 may be (h1(z)*h2(z))/(1+h2(z)+h1(z)*h2(z)).

The operations and the embodiments of the delta-sigma truncator 440 are similar to those of the delta-sigma truncator 140, because a person skilled in the art should understand how to apply the embodiment shown in FIGS. 2 and 3 to the delta-sigma modulator 400, further descriptions are therefore omitted here.

Figure 5:
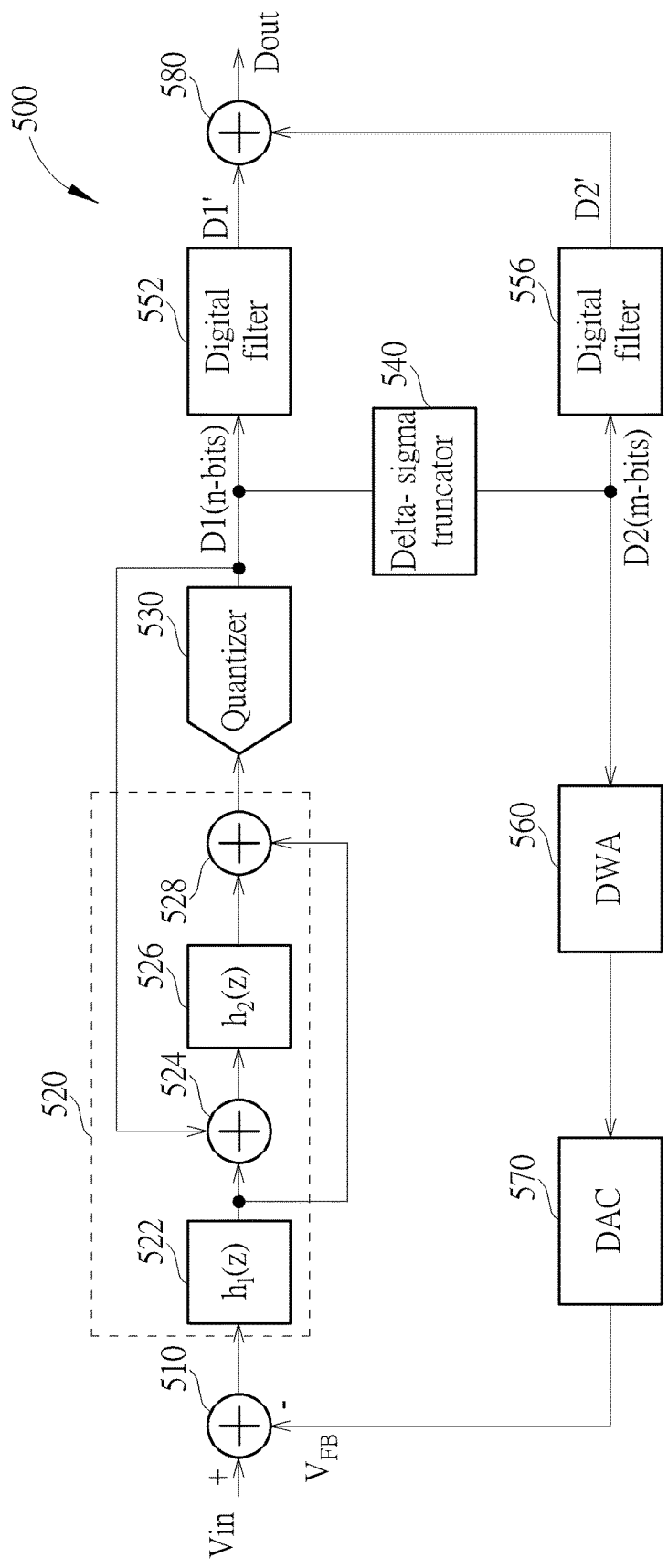
FIG. 5 is a diagram illustrating a delta-sigma modulator according to another embodiment of the present invention.

Please refer to FIG. 5, which is a diagram illustrating a delta-sigma modulator 500 according to another embodiment of the present invention. As shown in FIG. 5, the delta-sigma modulator 500 comprises a receiving circuit 510, a loop filter module 520, a quantizer 530, a delta-sigma truncator 540, a digital filter module comprising at least two digital filters 552 and 556, a DWA circuit 560 and a DAC 570. In the operations of the delta-sigma modulator 500, the receiving circuit 510 receives an input signal Vin and a feedback signal $V_{FB}$, and calculates a difference by subtracting the feedback signal $V_{FB}$ by the input signal Vin to generate a summation signal. The loop filter module 520 is arranged to filter the summation signal to generate a filtered summation signal. The quantizer 530 is arranged to generate an n-bit first digital signal D1 according to the filtered summation signal. The delta-sigma truncator 540 truncates the n-bit first digital signal D1 with noise shaping to generate a m-bit second digital signal D2, where "m" is less than "n". The digital filter 552 filters the first digital signal D1 to generate a filtered first digital signal D1', and the digital filter 556 filters the second digital signal D2 to generate a filtered second digital signal D2'. The output circuit 580 combines the filtered first digital signal D1' and the filtered second digital signal D2' to generate an output signal Dout. In addition, the m-bit second digital signal D2 is processed by the DWA circuit 560 and the DAC 570 to generate the feedback signal $V_{FB}$ to the receiving circuit 510.

In the embodiment shown in FIG. 5, the loop filter module 520 comprises a filter 522 having a transfer function h1(z), two combiners 524 and 528, and a filter 526 having a transfer function h2(z). The filter 522 filters the summation signal generated by the receiving circuit 510. The combiner 524 combines an output of the filter 522 and a feedback adjusting signal, wherein the feedback adjusting signal is generated according to the first digital signal D1 generated by the quantizer (e.g. the DAC operation is performed on the first digital signal D1 to generate the feedback adjusting signal). The filter 526 filters an output of the combiner 524. The combiner 528 combines an output of the filter 526 and a feed-forward adjusting signal to generate the filter summation signal to the quantizer 530, wherein the feed-forward adjusting signal is generated according to the output of the filter 522.

In this embodiment, the transfer function of the digital filter 552 may be (h2(z)+1)/(1+h1(z)+h2(z)+h1(z)*h2(z)), and the transfer function of the digital filter 556 may be (h1(z)+h1(z)*h2(z))/(1+h1(z)+h2(z)+h1(z)*h2(z)).

The operations and the embodiments of the delta-sigma truncator 540 are similar to those of the delta-sigma truncator 140, because a person skilled in the art should understand how to apply the embodiment shown in FIGS. 2 and 3 to the delta-sigma modulator 500, further descriptions are therefore omitted here.

In addition, the functions of the two combiners 524 and 528 and the filter 526 may be integrated into the quantizer 530 when a noise shaping successive approximation register (NSSAR) quantizer is implemented. Therefore, when the NSSAR quantizer is used, the transfer functions of the digital filters 552 and 556 are ideally independent from the transfer function h2(z) of the filter 526, and the design complexity of the digital filters 552 and 556 is simplified.

Briefly summarized, in the delta-sigma modulator of the present invention, a delta-sigma truncator is used to lower the feedback digital output signal of the DAC, and a digital filter module is applied to suppress the truncation error induced by the delta-sigma truncator. In addition, the delta-sigma truncator can further relax the matching requirement of the digital filter module and the analog loop filter module. Therefore, by using the delta-sigma truncator and the digital filter module together in the delta-sigma modulator, the hardware complexity can be reduced while keeping the performance of the delta-sigma modulator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delta-sigma modulator, comprising:
  a receiving circuit, for receiving an input signal and a feedback signal to generate a summation signal;
  a loop filter module, coupled to the receiving circuit, for filtering the summation signal to generate a filtered summation signal;
  a quantizer, coupled to the loop filter module, for generating a first digital signal according to the filtered summation signal;
  a delta-sigma truncator, coupled to the quantizer, for truncating the first digital signal to generate a second digital signal, wherein a bit number of the second digital signal is less than a bit number of the first digital signal;
  a digital filter module, coupled to the quantizer and the delta-sigma truncator, for filtering the first digital signal and the second digital signal to generate a filtered first digital signal and a filtered second digital signal, respectively;
  an output circuit, for generating an output signal according to the filtered first digital signal and the filtered second digital signal; and
  a first digital to analog converter, coupled to the delta-sigma truncator and the receiving circuit, for generating the feedback signal to the receiving circuit according to the second digital signal.

2. The delta-sigma modulator of claim 1, wherein the delta-sigma truncator comprises:
  a combiner, for combining the first digital signal and a digital feedback signal to generate an adjusted first digital signal;
  a truncation circuit, coupled to the combiner, for truncating the adjusted first digital signal to generate the second digital signal;
  a truncation error generator, coupled to the combiner and the truncation circuit, for generating a truncation error signal according to a difference between the adjusted first digital signal and the second digital signal; and
  a delay circuit, coupled to the truncation error generator, for delaying the truncation error signal to generate the digital feedback signal to the combiner.

3. The delta-sigma modulator of claim 1, wherein the delta-sigma truncator comprises:
  a truncation circuit, for truncating the first digital signal to generate the second digital signal;
  a truncation error generator, coupled to the quantizer and the truncation circuit, for generating a truncation error signal according to a difference between the first digital signal and the second digital signal; and
  a delay circuit, coupled to the truncation error generator, for delaying the truncation error signal to generate a delayed truncation error signal to adjust the filtered summation signal.

4. The delta-sigma modulator of claim 3, further comprising:
  a second digital to analog converter, coupled to the delay circuit, for performing a digital-to-analog converting operation upon the delayed truncation error signal to generate an analog truncation error signal; and
  a combiner, coupled between the loop filter module and the quantizer, for combining the filtered summation signal and the analog truncation error signal to generate an adjusted filtered summation signal;
  wherein the quantizer generates the first digital signal according to the adjusted filtered summation signal.

5. The delta-sigma modulator of claim 3, wherein the digital filter module further filters the delayed truncation error signal to generate a filtered delayed truncation error signal, and the output circuit generates the output signal according to the filtered first digital signal, the filtered second digital signal and the filtered delayed truncation error signal.

6. The delta-sigma modulator of claim 1, wherein the loop filter module comprises:
  a first filter, for filtering the summation signal;
  a combiner, coupled to the first filter, for combining an output of the first filter and a feedback adjusting signal;
  a second filter, coupled to the combiner, for filtering an output of the combiner to generate the filtered summation signal;
  wherein the feedback adjusting signal is generated according to the first digital signal generated by the quantizer.

7. The delta-sigma modulator of claim 1, wherein the loop filter module comprises:
  a first filter, for filtering the summation signal;
  a first combiner, coupled to the first filter, for combining an output of the first filter and a feedback adjusting signal;
  a second filter, coupled to the first combiner, for filtering an output of the first combiner;
  a second combiner, coupled to the second filter, for combining an output of the second filter and a feed-forward adjusting signal to generate the filter summation signal to the quantizer;
  wherein the feedback adjusting signal is generated according to the first digital signal generated by the quantizer, and the feed-forward adjusting signal is generated according to the output of the first filter.

8. The delta-sigma modulator of claim 1, wherein the quantizer is a noise shaping successive approximation register (NSSAR) quantizer.

9. The delta-sigma modulator of claim 1, wherein the delta-sigma truncator is a K-order delta-sigma truncator, wherein K is a positive integer greater than one.

10. The delta-sigma modulator of claim 9, wherein the delta-sigma truncator has a notch response.

11. A method for reducing leakage errors of a delta sigma modulator, comprising:
  receiving an input signal and a feedback signal to generate a summation signal;
  filtering the summation signal to generate a filtered summation signal;
  quantizing the filtered summation signal to generate a first digital signal;
  using a delta-sigma truncator to truncate the first digital signal to generate a second digital signal, wherein a bit number of the second digital signal is less than a bit number of the first digital signal;
  filtering the first digital signal and the second digital signal to generate a filtered first digital signal and a filtered second digital signal, respectively; and
  generating an output signal according to the filtered first digital signal and the filtered second digital signal.

12. The method of claim 11, wherein the step of using the delta-sigma truncator to truncate the first digital signal to generate a second digital signal comprises:

adjusting the first digital signal by using a digital feedback signal to generate an adjusted first digital signal;

truncating the adjusted first digital signal to generate the second digital signal;

generating a truncation error signal according to a difference between the adjusted first digital signal and the second digital signal; and delaying the truncation error signal to generate the digital feedback signal.

13. The method of claim 11, wherein the step of using the delta-sigma truncator to truncate the first digital signal to generate a second digital signal comprises:

truncating the first digital signal to generate the second digital signal;

generating a truncation error signal according to a difference between the first digital signal and the second digital signal; and delaying the truncation error signal to generate a delayed truncation error signal to adjust the filtered summation signal.

14. The method of claim 13, further comprising:

performing a digital-to-analog converting operation upon the delayed truncation error signal to generate an analog truncation error signal; and adjusting the filtered summation signal by using the analog truncation error signal to generate an adjusted filtered summation signal;

wherein the step of quantizing the filtered summation signal to generate the first digital signal comprises:

generating the first digital signal according to the adjusted filtered summation signal.

15. The method of claim 13, further comprising:

filtering the delayed truncation error signal to generate a filtered delayed truncation error signal; and the step of generating the output signal comprises:

generating the output signal according to the filtered first digital signal, the filtered second digital signal and the filtered delayed truncation error signal.

* * * * *